US010866406B2

(12) United States Patent
Finan et al.

(10) Patent No.: US 10,866,406 B2
(45) Date of Patent: Dec. 15, 2020

(54) ACTIVE COATING APPARATUS, METHODS AND APPLICATIONS

(71) Applicant: Arizona Board of Regents on Behalf of the University of Arizona, Tucson, AZ (US)

(72) Inventors: Emily Finan, Tucson, AZ (US); Eduardo Bendek, Tucson, AZ (US); Thomas Milster, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 93 days.

(21) Appl. No.: 16/178,184

(22) Filed: Nov. 1, 2018

(65) Prior Publication Data
US 2019/0137755 A1 May 9, 2019

Related U.S. Application Data

(60) Provisional application No. 62/579,921, filed on Nov. 1, 2017.

(51) Int. Cl.
*G02B 26/08* (2006.01)
*G02B 5/08* (2006.01)
(52) U.S. Cl.
CPC ....... *G02B 26/0825* (2013.01); *G02B 5/0808* (2013.01)
(58) Field of Classification Search
CPC .................. G02B 26/0825; G02B 5/0808
See application file for complete search history.

(56) References Cited

U.S. PATENT DOCUMENTS

2007/0258151 A1  11/2007  Frumker et al.
2012/0170134 A1*  7/2012  Bolis ................ G02B 3/14
                                                    359/666

FOREIGN PATENT DOCUMENTS

CN    101021617 A    8/2007
CN    101063748 A   10/2007
JP    2008216883     9/2008

OTHER PUBLICATIONS

Pilar, Jan, et al, "Design of an Optimized Adaptive Optics System With a Photo-Controlled Deformable Mirror", IEEE Photonics Technology Letters, 28(13):1422-1425 (2016) DOI: 10.1109/LPT.2016.2551464.

(Continued)

*Primary Examiner* — Wen Huang
(74) *Attorney, Agent, or Firm* — Bond Schoeneck & King, PLLC; George McGuire

(57) ABSTRACT

An active thin film (coating) that enables dynamic modification of a reflective surface for wavefront control. The embodied active coatings are photonic devices comprising an optically thin layer of photosensitive polymer disposed between a substrate and a reflective optical coating. The polymer volume can be controlled from molecular to microscopic (sub-nanometer to micrometer) levels when light of a specific polarization and wavelength is applied from the backside of the coating surface (i.e., through a transmissive substrate for the stimulating light). As a result of the polymer volume change, the coating exhibits localized thickness changes (realized as dips/bumps that function as localized actuators) that modify the phase of incident light on the reflective surface. The size and shape of these photonic dip/bump actuators can be adjusted by design and can be placed on both flat and curved optical surfaces. Resolution and dynamic range can be controlled by the light intensity.

19 Claims, 5 Drawing Sheets

(56) References Cited

OTHER PUBLICATIONS

Banerjee, Kaustubh et al., PVDF actuated, lightweight deformable thin mirror for adaptive optics, 2016 International Conference on Optical MEMS and Nanophotonics (OMN), DOI: 10.1109/OMN.2016.7565915.
Déry, J.-P., et al., Aluminum-coated elastomer thin films for the fabrication of a ferrofluidic deformable mirror. (2016) J. Appl. Polym. Sci., 134, 44542 doi: 10.1002/app.44542.
Crill, Brendan, The 2017 ExEP Technology Gap List, NASA's Exoplanet Exploration Program, Jan. 3, 2017.

* cited by examiner

ACTIVE COATING APPARATUS, METHODS AND APPLICATIONS

CROSS-REFERENCE TO RELATED APPLICATION

This application claims priority to U.S. Provisional Patent Application Ser. No. 62/579,921 filed Nov. 1, 2017 and entitled "ACTIVE COATING APPARATUS, METHODS AND APPLICATIONS," the entire disclosure of which is incorporated herein by reference.

FIELD OF THE INVENTION

The present disclosure is directed generally to optical thin film coatings and optical apparatus having and utilizing an optical thin film coating; more particularly, to photonically active (i.e., controllably deformable) optical thin film coatings that allow dynamic modification of an optical surface for enabling wavefront control; and most particularly, to a photonic deformable mirror and associated methods and applications.

BACKGROUND

While particular applications of the embodied technology include Sparse-Photonic Deformable Mirrors (S-PDMs), Switchable-Photonic Diffractive Pupils (S-PDPs), and Photonic Focal Plane Masks, the embodied technology has a wide range of applications in astrophysics and industry. In particular, applications for exoplanet detection include high-density deformable mirrors with more than 96×96 actuators that are able to create dark zones where planets can be discovered; switchable Diffractive Pupils to calibrate distortions of wide field cameras allowing astrometric exoplanets' mass determination; and coronagraph technologies for segmented mirrors enabling an active Phase Induced Amplitude Apodizatlon Complex Mask Coronagraph.

Optical lithography for production of computer circuits requires extremely controlled optical systems in order to achieve high yields in manufacturing. The optical systems are complex and expensive because they require very fine resolution over a relatively large area in order to produce large numbers of circuits on a computer chip. For example, modern systems use a 193 nm wavelength light source and immersion optics that produce diffraction-limited imaging with an intrinsic Rayleigh resolution of 90 nm and a process resolution of around 40 nm. In order to make even smaller features, extreme ultraviolet (EUV) optical systems are being developed with intrinsic Rayleigh resolution of around 15 nm. These systems require ultra-precise fabrication of their optical elements in order to obtain the desired optical performance and must be operated in vacuum. EUV elements change and degrade over time and must be periodically replaced.

SUMMARY

There are many advantages and benefits provided by a photonic deformable mirror (P-DM) as embodied and disclosed herein. The use of active wavefront control for both optical correction and optical patterning represents a novel, useful approach that is difficult to implement or non-usable due to complications involved with the opto-mechanical structure of currently available deformable mirrors. The number of actuators and their displacements do not match well with state-of-the-art lithography systems. The embodied P-DM can correct an optical wavefront on a nanometer scale with programmable positioning of nanometer-scale surface deformations, which is not possible with currently available deformable mirrors. The deformable surface is activated by light passing through a transmissive substrate, which advantageously isolates the control optical system from the lithographic optical system, where the only common surface is the deformable surface itself. A P-DM lithography system could increase performance by actively correcting small errors in as-built systems, as well as correcting small errors as the elements age. In addition, it will provide for wavefront engineering tailored to maximizing performance of the optical system for specific circuit patterns.

The present disclosure is directed to a photonic deformable mirror (P-DM). According to an aspect, the present invention is a photonic deformable mirror (P-DM) having a substrate, an active (deformable) thin film coating disposed on a front surface of the substrate, and an optical coating disposed on the active coating.

According to an embodiment, the optical coating is a reflective coating.

According to an embodiment, the reflective coating is composed of at least one of aluminum, silver, and gold.

According to an embodiment, the active (deformable) thin film coating is a photosensitive polymer thin film layer whose volume can be controlled when light of a specific polarization and wavelength is incident on the photosensitive polymer thin film layer through a backside of a transmissive surface of the photosensitive polymer thin film layer.

According to an embodiment, the volume of the photosensitive polymer thin film layer can be controlled from sub-nanometer to micrometer levels.

According to an embodiment, the one or more features are at least one of a dip or bump in the optical coating.

According to an embodiment, the substrate has a curved surface.

According to an embodiment, the substrate is a mirror.

According to an embodiment, the substrate is composed of glass.

According to another aspect, the present invention is a method for controlling light. The method includes the steps of: (i) providing a photonic deformable mirror (P-DM) comprising a substrate, an active (deformable) thin film coating disposed on a front surface of the substrate, and an optical coating disposed on the active coating; and (ii) scanning a stimulating light source over a backside of the active (deformable) thin film coating to create one or more features in the optical coating that modifies a phase of incident light on the optical coating.

According to an embodiment, the one or more features are at least one of a dip or bump in the optical coating.

According to an embodiment, scanning a stimulating light source over a backside of the active (deformable) thin film coating causes a change in a volume of the active (deformable) thin film coating.

According to an embodiment, light from the light source has a specific polarization and wavelength.

According to an embodiment, the active (deformable) thin film coating is a photosensitive polymer thin film layer.

According to an embodiment, the optical coating is a reflective coating.

According to another aspect, the present invention is an alternative method for controlling light. The method includes the steps of: (i) providing a photonic deformable mirror (P-DM) comprising a substrate, a photosensitive polymer thin film layer having a first volume and disposed on a front surface of the substrate, and an optical coating disposed on the photosensitive polymer thin film layer; (ii) scanning a stimulating light source over a backside of the photosensitive polymer thin film layer, resulting in the change of the first volume of the photosensitive polymer thin film layer to a second volume and in the formation of one or more features in the optical coating; and (iii) modifying a phase of incident light on the optical coating of the P-DM based on a size and shape of the one or more features.

According to an embodiment, the one or more features are at least one of a dip or bump in the optical coating.

According to an embodiment, the substrate has at least one of a flat surface or a curved surface.

According to an embodiment, the optical coating is a reflective coating.

These and other aspects of the invention will be apparent from the embodiments described below.

BRIEF DESCRIPTION OF THE DRAWINGS

The present invention will be more fully understood and appreciated by reading the following Detailed Description in conjunction with the accompanying drawings, in which.

DETAILED DESCRIPTION OF EMBODIMENTS

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

An aspect of the invention is a photonic deformable mirror (P-DM) comprising and/or essentially consisting of a substrate, an active (deformable) thin film coating disposed on a front surface of the substrate, and an optical (reflective) coating disposed on/over the active coating. The embodied active (deformable) thin film coating is a photosensitive polymer thin film layer(s) whose volume can be controlled from molecular to microscopic (sub-nanometer to micrometer) levels when light of a specific polarization and wavelength (i.e., the stimulating light) is incident on the polymer layer(s) through the backside of the stimulating light transmissive surface. As a result of the polymer layer(s) volume change, the thin film coating will exhibit dips or bumps (akin to localized photonic actuators) in the reflective optical coating that modify the phase of incident light on the reflective optical coating of the P-DM. The size and shape of these photonic dip/bump actuators can be adjusted by design and can be placed on both flat and curved optical surfaces. These photonic active coating devices are activated by rapidly scanning stimulating light over the actuators. Exemplary advantages of the embodied invention include eliminating the complexity and scalability limitations of electrically- or magnetically-actuated deformable mirror that are currently available. Moreover, resolution and dynamic range can be controlled by the stimulating light intensity, simplifying resolution and discretization limitations.

Figure 1A:
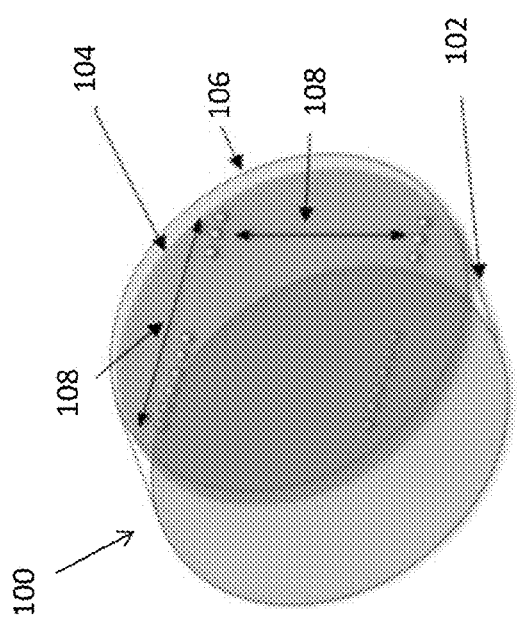
FIG. 1A is a backside view diagrammatic representation of a P-DM, according to an embodiment.
Figure 1B:
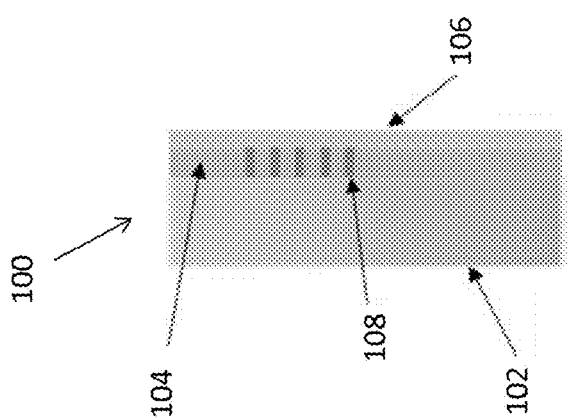
FIG. 1B is a cross-sectional view diagrammatic representation of the P-DM in FIG. 1A.
Figure 1C:
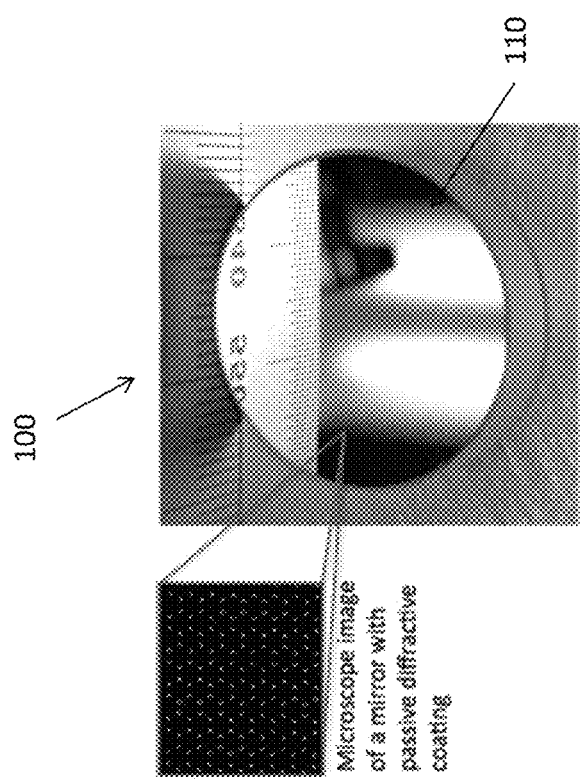
FIG. 1C is a perspective view of the back side of a P-DM, according to an embodiment.

Referring now to FIGS. 1A-1B, there are shown backside and cross-sectional views diagrammatic representations of a P-DM 100, according to an embodiment. The P-DM 100 includes or essentially consists of a mirror substrate 102 that is coated with a layer of photosensitive (photo-responsive) polymer material 104, onto which a reflective coating 106 (e.g., aluminum, silver, gold, etc.) is applied. The substrate 102 is a material (e.g., glass) that is transmissive to the polymer coating 104 stimulating light wavelength through the backside of the substrate 102. Localized focusing of light on the polymer coating 104 figuratively forms actuators 108 that are dynamically written with a scanning laser beam into a pattern suitable for a desired application. The stimulating light causes localized volumetric changes in the polymer coating 104 thus creating a phase surface on the reflective coating 106 to control light incident thereon. As shown in FIG. 1C, the appearance of the P-DM 100 should be similar to the previously fabricated physical mirror with a passive diffractive coating 110.

In the embodiment depicted in FIGS. 1A-1B, the structure of the P-DM 100 enables manufacturing of completely solid-state devices with a very large (100,000) number of actuators 108. For example, the P-DM 100 may have approximately 300 rows of actuators 108 and approximately 300 columns of actuators. In Photonic actuation reduces the constraints of traditional mechanical actuators as the actuator shape, size, and configuration is customizable and there is no wiring required to supply the activation.

Figure 2:
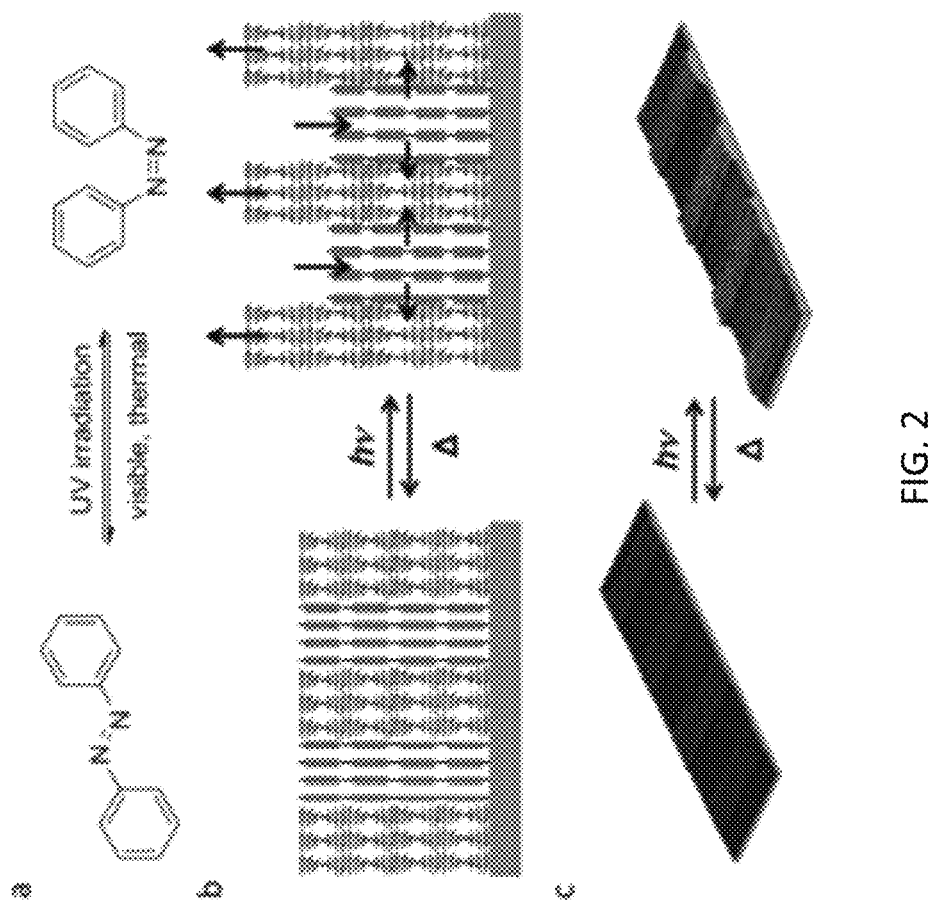
FIG. 2 includes a chemical structure, graph, and diagram of the unique behavior of a typical photo-responsive polymer coating comprised of azobenzene when exposed to light.

Turning now to FIG. 2, there is shown chemical structures, graphs, and diagrams of the unique behavior of a typical photo-responsive polymer coating comprised of azobenzene when exposed to light. Azobenzene is a photochromic chromophore that undergoes reversible configurational isomerization (i.e., trans→cis→trans) when irradiated with light in the UV-Vis region. The timescale of this reversible process can be controlled by the molecular photochemistry. The excitation wavelength is matched to the chromophore structure. Repeated isomerization results in large-scale reorientation of the trans chromophore perpendicular to the polarization of the incident light. When induced in an azobenzene-containing polymer matrix, the result of repeated isomerization of the azobenzene chromophore is motion on the molecular, nanoscale, and micrometer levels. In the embodied invention the photo-activated chromophore reorientation property is used to manufacture and control the sparse DM actuators.

Initial experimental work has involved the following three types of materials: (1) commercially available azopolymers, (2) methacrylate based side-chain azopolymers, and (3) polymer backbones with enhanced durability in space. Several azopolymers are commercially available and include: PAZO (poly{1-[4-(3-carboxy-4-hydroxyphenylazo)benzenesulfonamido]-1,2-ethanediyl, sodium salt}), pDR1M (poly[Disperse Red 1 methacrylate]), and pDR13M (poly[Disperse Red 13 methacrylate]). Next, for methacrylate based side-chain azopolymers, there is extensive literature in the photofabrication of surface relief gratings with methacrylate based polymer, and recent advances in controlled polymerization techniques, particularly atom transfer radical polymerization (ATRP) and living free-radical polymerization (LFRP), will allow the preparation of methacrylate azopolymers with enhanced levels of structural control such as precise molecular weight ranges and block co-polymer architectures. Finally, for polymer backbones with enhanced durability in space, polyimides (e.g., Kapton) are commonly used in space applications because of relative resistance to degradation by atomic oxygen exposure. New azopolymers based on polyimide backbones will be prepared and used to investigate surface relief grating photofabrication.

Azobenzene polymers have demonstrated surface expansion capable of providing each actuator with a stroke of 0.5 µm or more when activated at 405 nm. In an exemplary embodiment, a P-DM enabling high-contrast imaging and astrometry applications has 10,000 actuators with stroke of 0.5 µm or more when activated with 405 nm light. Table 1 specifies in greater detail the derived specifications for the device. The Threshold value column shows the minimum performance that the device should achieve.

TABLE 1

Active Coating Device Applications and Requirements

| Science Requirement | Value | Derived Requirement | Req. Value | Design value | Rationale/comments |
|---|---|---|---|---|---|
| High-Contrast Imaging - Deformable Mirror | | | | | |
| R1.1 Outer working angle | >50λ/D | Actuator count | 100 × 100 | 300 × 300 | Minimum number of actuator to crate the dark zone |
| R1.2 Dark Zone contrasts | 1 × 10⁻⁹ | Actuator usable stroke | 256 nm PV | 300 nm PV | Max. stroke simulation = 206 nm PV plus 25% margin = 256 nm PV |
| | | Maximum static error | 158 nm PV | 200 nm PV | Defined by typical diff. limited optics λ/4 = 158 nm PV |
| | | Actuator total stroke | 414 nm PV | 500 nm PV | Sum of usable stroke + stroke to correct static error |
| | | Resolution | 1 nm | 0.1 nm | Actuator creep to degrade contrast to the requirement to 5 × 10−9 |
| | | Actuator diameter | 20 um | 50 um | Minimum energy to cancel bright speckles ~10-4 (fill factor = 4%) |
| R1.3 contrast stability | 1 × 10−8 | Maximum actuator creep | 2% | 0.50% | Actuator creep to degrade contrast one order of magnitude (1 × 10−8) |
| R 1.4 Slew time | 30 s | Time 98% of command | 30 s | 1 s | Residual stroke will degrade contrast one order of magnitude |
| Distortion calibration - Diffractive pupil | | | | | |
| R2.1 Spikes FoV | 300L/D | Actuator count | 300 | 300 | Calibrate distortions a large FoV |
| R2.2 Spikes stability | 1% | Actuator creep | 1% | 0.50% | Diffractive pupil stability |
| R2.3 Diff. pupil efficiency | >1% diff. light | Min. actuator diameter | 5 um | 5 um | Enable diff pupil with less than 1% light scattering in a 300 × 300 grid |

There have been decades of research involving azobenzenes as light-responsive materials, and surface relief gratings (SRG) can be created in any polymer coating that contains bound azobenzene groups. Both side chain and main chain azopolymers have been investigated for SRG formation including different classes of azobenzene polymers such as epoxy, polyacrylates, polyesters, and conjugated polymers. The azopolymers within SRG literature have been grouped into three categories: azobenzenes, amino-substituted azobenzenes, and electron-donor/electron-acceptor-substituted azobenzenes (pseudo-stilbene).

Below is a selection of materials and corresponding parameters reported for SRG formation:

TABLE 2

Surface Relief Gratings

| Material | Note | Substrate | Polymer Thickness | Wavelength | Beam Intensity |
|---|---|---|---|---|---|
| PDO3 | synthesized from diglycidyl ether of bisphenol A and 4-(4'-nitrophenylazo)phenyl amine | Glass slide | 0.9 micron | 488 nm-543.5 nm | 238 mW/cm²- 24 W/cm² |

TABLE 2-continued

Surface Relief Gratings

| Material | Note | Substrate | Polymer Thickness | Wavelength | Beam Intensity |
|---|---|---|---|---|---|
| HPAA-NO$_2$ | synthesized by post-modification from high molecular weight poly(acrylic acid) | Glass slide | 0.35 micron | 543.5 nm | 238 mW/cm$^2$-24 W/cm$^2$ |
| Azobenzene containing dimethacrylate | Custom synthesization of a mixture of liquid-crystal acrylate monomers | Glass substrate, patterned with ITO | 4 microns | 365 nm | 30 mW/cm$^2$ |
| pDR13A, pNDR1M, pnCARBA, p3RM, pDRSAM, pDRASM, pBTAMC | | unknown | 4 microns | 488 nm or 514 nm | 10-100 mW/cm$^2$ |

TABLE 3

Other Photosensitive Materials

| Mixture of PETMP, MDTVE, EGDMP monomers with photoinitiators Irgacure 184, Irgacure 819 | Laminated composite exhibiting photoinduced bending (This is a sandwich of materials that bends when exposed to light, so not a SRG, but has an azopolymer bonded to NOA65 (and not a glass substrate) with a much greater thickness. | NOA65 | 0.17 mm | 365 nm | 40 mW/cm$^2$ |

Two initial P-DM configurations are proposed for a 25 mm diameter substrate, where each will be manufactured in hexagonal and square grids as set forth in Table 4.

TABLE 4

| Configuration | Number of Actuators | Spacing | Actuator Radius | 2D-Fill factor |
|---|---|---|---|---|
| High-density | 300 × 300 | 83 µm | 15 µm | 10.2% |
| Low-density | 100 × 100 | 250 µm | 50 µm | 12.5% |

Applications & Methods

The Kepler space telescope has revealed that many stars have roughly Earth-size planets that are in the habitable zones of their stars (exo-Earths). One of the most important next steps is spectroscopic characterization of exo-Earths and mass measurements, which would tell us whether they possess an atmosphere, liquid water, and biomarker gases, such as oxygen and methane. Directly imaging an exo-Earth (at least for Sun-like stars) and astrometry measurements are necessary for determining mass. This goal is reflected in NASA's strategic plan, the "Enduring Quests, Daring Visions" 30-year roadmap, and the Astro2010 decadal survey. In fact, about a third of the 30-year roadmap considers the question, "Are We Alone?" In the Astro2010 decadal survey, one of the key questions posed is "Do habitable worlds exist around other stars?"

Future ground-based telescopes such as the Giant Magellan Telescope (GMT), the Thirty Meter Telescope (TMT) and the European Extremely Large Telescope (E-ELT) will be equipped with powerful coronagraphs that may be able to detect exo-Earths around M-dwarf stars in the mid-2020s, but space missions will be necessary to detect exo-Earths around Sun-like stars. NASA is also currently undergoing four studies of large flagship missions for the 2030s, two of which (Habitable Exoplanet Imaging Mission or HabEx, and Large UV/Optical/IR Surveyor, or LUVOIR) are designed to be capable of detecting and spectrally characterizing a statistically significant number of exo-Earths, as well as many larger planets.

The embodied invention will benefit at least two key technologies that are in preparation for those missions. First, high-density deformable mirrors with more than 96×96 actuators that are able to create dark zones where planets can be discovered has been identified as CG-3 by NASA's Exoplanet Exploration Program in the 2017 Coronagraph Gap List (https://exoplanets.nasa.gov/exep/technology/gap-lists/). Second, coronagraph technologies for segmented mirrors will benefit by enabling an active PIAACMC mask.

High-precision imaging stellar astrometry is one of the most promising techniques for planetary mass and orbit determination. The combined measurements of direct imaging and astrometry offer greater detection sensitivity and reliability than possible with separate missions. However, only a few planets have been detected using astrometry, because the astrometric signal of most habitable exoplanets around nearby stars (<10 pc) causes a sub-µas signal on their host star; for example, an Earth-like astrometric signal ranges from 1 µas for stars at 3 pc to 0.3 µas at 10 pc distance.

The main limiting factor in sparse-field astrometry, besides photon noise, is the non-systematic dynamic distortions that arise from perturbations in the optical train. Wide-field cameras used for imaging astrometry are more sensitive to distortion as their Field of View (FoV) increases, and in most cases distortion dominates the error budget.

Figure 3:
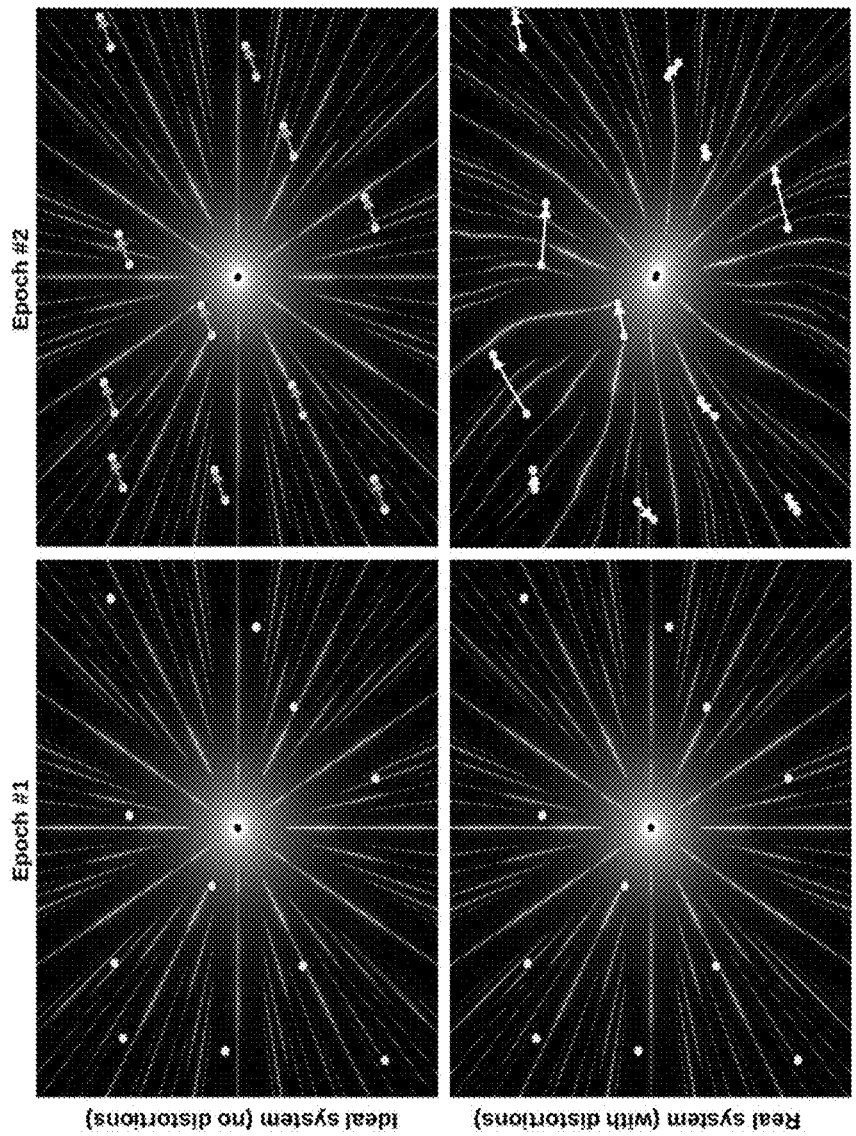
FIG. 3 is an astrometry calibration algorithm using the diffractive spikes.

To overcome this limitation, a concept has been proposed that uses a Diffractive Pupil (DP) to generate precise fiducial features in the image plane, which appear as radial streaks or spikes, as shown in FIG. 3. In particular, FIG. 3 shows an astrometry calibration algorithm using the diffractive spikes.

On the top row two measurements or epochs are shown for a perfect system. An astrometric signal creates a uniform differential motion of the pixels and the reference stars. In the lower row a system that is affected by distortions cause errors in the astrometric measurement, which can be calibrated using the diffractive spikes as a reference. These diffractive features can be used to calibrate dynamic or relative distortions, because they are imaged by the same optical systems. Therefore, their positions also change with distortions, thus serving as a reference for calibration. This technique has been validated in the laboratory, which demonstrates its ability to measure the astrometry signal with unprecedented accuracy that will enable measuring earth-like planets masses.

By applying this concept to calibrate dynamic distortions using a DP on a 1.4 m telescope and additionally rolling the telescope to average down detector effects with a 0.3 degree FoV, it is possible to achieve 0.2 µas astrometric accuracy. Since the astrometric signal of the host star is measured with respect to the spikes and not to the star PSF, this technique is compatible with a direct imaging mission. The narrow field around the host star where the planet is expected is imaged by a coronagraph, and the wide field is imaged by astrometric module. Therefore, both detection techniques are simultaneously enabled in a single mission. This concept works for a wide range of mission sizes, but the ultimate accuracy strongly depends on the aperture size and the FoV of the telescope.

The scientific community has widely not adopted the diffractive pupil in telescopes because the diffractive features are permanent, and therefore they impact other astrophysics measurements that are made through the same optical components. The solution is to have the capability of "turning ON and OFF" the diffractive pupil, to use it when exoplanet masses are measured and to remove it when other astrophysical phenomena are observed. The embodied invention will enable a switching DP.

The majority of astronomical Deformable Mirror (DMs) applications (Table 5) are in atmospheric, or "conventional" adaptive optics, where the primary requirement is to correct large low-order phase aberrations (tip, tilt, defocus, etc.) as well as smaller mid-spatial frequencies, which usually means that a DM must be capable of producing high strokes at high speeds, as shown in Table 6.

complexity, and improve the performance of such systems. Furthermore, the use of conventional AO DMs for high contrast imaging biases the general thinking about the problem. In order to create a high contrast region, it is not necessary to correct for phase errors across the pupil, as conventional DMs do; it is only necessary to redirect a small amount of the starlight in such a way to make it destructively interfere with focal plane speckles in the high contrast region of interest. For example, a DM where only a small fraction of the surface is deformable would work, provided that we pick the right fraction of the surface. We refer to such a DM as a "Sparse DM". Such a DM would have the following advantages over conventional DMs for high contrast imaging:

Actuated with light, no need to wire thousands of high voltage cables;
Compact and solid state, very compact packaging possible;
Finer resolution in terms of modulated speckle contrast per nm of stroke;
Sparse DM can be constructed on curved surfaces with power, reducing optics complexity;
Potentially enable a path towards actuable primaries for wavefront control DP calibration.
Expand Super-Nyquist Wavefront Control dark zones.
Small Strehl degradation as a result of creating a dark zone compared to a conventional DM.

TABLE 6

Comparison of Conventional AO and High-Contrast Imaging DM Requirements

| | Conventional AO | High Contrast imaging |
|---|---|---|
| Primary Goal | High Strehl | High Contrast |
| Correction type needed | Large, pupil-plane phase errors | Faint, slowly varying focal plane speckles |
| Stroke requirement | Large, >1 µm | Small <1 µm |
| Speed | Fast (1 kHz+) | Slow (<1 Hz typically sufficient) |
| Full surface modulation | Required | Sparse surface modulation is enough! |

The embodied active coating technology allows manufacturing of a switchable photonic diffractive pupil S-PDP

TABLE 5

Summary of Technology Applications

| Proposed development | Astrophysics application | Specific application | Physical implementation | Typical feature shape and size |
|---|---|---|---|---|
| Photo-Active Coating Mirrors | High-contrast imaging | Sparse DM | Array of active coating actuators | Square grid, round actuators ~100 um diameter, ~1% or aperture |
| | | PIAA CMC | Active arcs in the CMC mask | Arcs 5 um thick each, 100 um total mask size |
| | Astrometry for mass determination | Switchable diffractive pupil | Array of active coating actuators | Hexagonal grid, actuator size ~0.05% of aperture, 1% fill factor |

The requirements for high-contrast imaging are very different. High contrast by itself does not require a high Strehl ratio. Speed and stroke requirements are also different. Despite the differences in requirements, high contrast applications typically use deformable mirrors developed for conventional adaptive optics (AO) because of their availability. However, developing a DM specifically designed for high-contrast applications has the potential to reduce cost, removing the main drawback of a "permanent" alteration of the primary mirror. One example of an S-DP is to arrange active 10 µm diameter actuators in a hexagonal pattern with a hexagon side pitch of 50 µm. This same configuration has been fabricated as a permanent DP and tested successfully in our laboratory.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The above-described embodiments of the described subject matter can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single device or computer or distributed among multiple devices/computers.

What is claimed is:

1. A photonic deformable mirror (P-DM), comprising:
a substrate;
an active deformable thin film coating disposed on a front surface of the substrate; and
an optical coating disposed on the active coating,
wherein the active deformable thin film coating is a photosensitive polymer thin film layer whose volume can be controlled when light of a specific polarization and wavelength is incident on the photosensitive polymer thin film layer through a backside of a transmissive surface of the photosensitive polymer thin film layer.

2. The P-DM of claim 1, wherein the optical coating is a reflective coating.

3. The P-DM of claim 2, wherein the reflective coating is composed of at least one of aluminum, silver, and gold.

4. The P-DM of claim 1, wherein the volume of the photosensitive polymer thin film layer can be controlled from sub-nanometer to micrometer levels.

5. The P-DM of claim 1, wherein a change in the volume of the photosensitive polymer thin film layer results in one or more features in the optical coating.

6. The P-DM of claim 5, wherein the one or more features are at least one of a dip or bump in the optical coating.

7. The P-DM of claim 1, wherein the substrate has a curved surface.

8. The P-DM of claim 1, wherein the substrate is a mirror.

9. The P-DM of claim 1, wherein the substrate is composed of glass.

10. A method for controlling light, comprising:
providing a photonic deformable mirror (P-DM) comprising a substrate, an active deformable thin film coating disposed on a front surface of the substrate, and an optical coating disposed on the active coating, wherein the active deformable thin film coating is a photosensitive polymer thin film layer whose volume can be controlled when light of a specific polarization and wavelength is incident on the photosensitive polymer thin film layer through a backside of a transmissive surface of the photosensitive polymer thin film layer; and
scanning a stimulating light source over a backside of the active thin film coating to create one or more features in the optical coating that modifies a phase of incident light on the optical coating.

11. The method of claim 10, wherein the one or more features are at least one of a dip or bump in the optical coating.

12. The method of claim 10, wherein the step of scanning the stimulating light source over the backside of the active (deformable) thin film coating causes a change in a volume of the active (deformable) thin film coating.

13. The method of claim 10, wherein light from the light source has a specific polarization and wavelength.

14. The method of claim 10, wherein the active (deformable) thin film coating is a photosensitive polymer thin film layer.

15. The method of claim 10, wherein the optical coating is a reflective coating.

16. A method for controlling light, comprising:
providing a photonic deformable mirror (P-DM) comprising a substrate, a photosensitive polymer thin film layer having a first volume and disposed on a front surface of the substrate, and an optical coating disposed on the photosensitive polymer thin film layer, wherein the active deformable thin film layer is a photosensitive polymer thin film layer whose volume can be controlled when light of a specific polarization and wavelength is incident on the photosensitive polymer thin film layer through a backside of a transmissive surface of the photosensitive polymer thin film layer; and
scanning a stimulating light source over a backside of the photosensitive polymer thin film layer, resulting in the change of the first volume of the photosensitive polymer thin film layer to a second volume and in the formation of one or more features in the optical coating; and
modifying a phase of incident light on the optical coating of the P-DM based on a size and shape of the one or more features.

17. The method of claim 16, wherein the one or more features are at least one of a dip or bump in the optical coating.

18. The method of claim 16, wherein light from the light source has a specific polarization and wavelength.

19. The method of claim 16, wherein the optical coating is a reflective coating.

* * * * *